United States Patent [19]
Liebmann et al.

[11] Patent Number: 5,936,738
[45] Date of Patent: Aug. 10, 1999

[54] FOCUS MONITOR FOR ALTERNATING PHASE SHIFTED MASKS

[75] Inventors: Lars W. Liebmann, Poughquag; Richard A. Ferguson, Pleasant Valley, both of N.Y.

[73] Assignee: International Business Machines Corporation, Armonk, N.Y.

[21] Appl. No.: 09/127,741

[22] Filed: Aug. 3, 1998

[51] Int. Cl.⁶ .................................................. G01B 11/00
[52] U.S. Cl. .......................... 356/401; 356/376; 356/356
[58] Field of Search ...................................... 356/401, 376, 356/356

[56] References Cited

U.S. PATENT DOCUMENTS

| | | | |
|---|---|---|---|
| 4,631,416 | 12/1986 | Trutna, Jr. | 250/548 |
| 4,664,524 | 5/1987 | Hattori et al. | 356/401 |
| 5,300,786 | 4/1994 | Brunner et al. | |

OTHER PUBLICATIONS

William H. Arnold, "A Focus Vernier For Optical Lithography," Proc. SPIE, vol. 1926, Mar. 2–4, 1993, pp. 380–392.

H. Ohtsuka et al., "Conjugate Twin–Shifter for the New Phase Shift Method to High Resolution Lithography," Proc. SPIE, vol. 1463, 1991, pp. 112–123.

*Primary Examiner*—Frank G. Font
*Assistant Examiner*—Reginald A. Ratliff
*Attorney, Agent, or Firm*—Ratner & Prestia; H. Daniel Schnurmann

[57] ABSTRACT

A focus monitor for establishing best focus of a lithographic system in semiconductor wafers. The focus monitor has a phase region having a first phase and a slot disposed within the phase region having a gap size indicative of a defocus level of the lithographic system.

36 Claims, 12 Drawing Sheets

FOCUS MONITOR FOR ALTERNATING PHASE SHIFTED MASKS

TECHNICAL FIELD

This invention relates generally to the field of photolithographic projection of a pattern onto a semiconductor wafer, and more specifically to establishing a best focus for phase shifted masks by determining the direction and magnitude of the system defocus error.

BACKGROUND OF THE INVENTION

As the focal depth of optical steppers decreases, it becomes more important to determine the position of best focus accurately and quickly. Semiconductor CMOS chips are manufactured on silicon wafers by a sequence of material additions (i.e., low pressure chemical vapor depositions, sputtering operations, etc.), material removals (i.e., wet etches, reactive ion etches, etc.) and material modifications (i.e., oxidations, ion implants, etc.). In order to build very small, electrically active devices on the wafer, the impact of these operations has to be confined to very small, well-defined regions on the wafer.

Lithography, in the context of manufacturing CMOS devices, is the process of patterning openings in photosensitive polymers. These openings define small areas in which the silicon base materials are modified by a specific operation in a sequence of processing steps. The manufacturing of CMOS chips involves repetitive patterning of photoresist, followed by an etch, implant or deposition, and ending with the removal of the expended photoresist to make way for the new resist to be applied for other iterations of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, these lithography tools are commonly referred to as steppers.

The resolution R of an optical projection system, such as a lithography stepper, is limited by the parameters described in Rayleigh's equation:

$$R = K^* (\lambda / NA) \qquad (1)$$

where $\lambda$ is the wavelength of the light source used in the projection system and NA is the numerical aperture of the projection optics used. K is a factor describing how well a combined lithography system can utilize the theoretical resolution limit in practice, and can range from 0.5 to 0.8 for standard exposure systems.

Conventional photomasks, commonly referred to as chrome on glass (COG), consist of chromium patterns on a quartz plate, allowing light to pass wherever the chromium has been removed from the mask. Light of a specific wavelength is projected through the mask onto the wafer, exposing the resist wherever hole patterns are placed on the mask. Exposing the resist to light of an appropriate wavelength causes modifications in the molecular structure of the resist polymers which, in turn, allow a developer to dissolve and remove the resist in the exposed areas. The photomask, when illuminated, can be pictured as an array of individual, infinitely small light sources that can be either turned on or turned off. If the amplitude of the electric field vector, which describes the light radiated by the individual light sources, is mapped across a cross section of the mask, a step function may be plotted reflecting the two possible states that each point on the mask may have.

A perfectly square step function exists only in the theoretical limit of the exact mask plane. At any distance away from the mask, such as in the wafer plane, the diffraction effect will cause images to exhibit a finite image slope. At small dimensions, that is, when the size of the images to be printed are small relative to $\lambda / NA$, electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is, the intensity difference between adjacent light and dark features. An increase in the light intensity in nominally dark areas will eventually cause adjacent features to print as one combined structure rather than discrete images. The quality with which small images can be replicated in lithography depends largely on the available process latitude, that is the amount of allowable dose and focus variation that still results in correct image size.

Determination of optical focus in photolithography has always been a time consuming and relatively uncertain process. Traditionally, focus is determined by exposing a matrix field through a range of focus settings, then inspecting the resultant pattern for the best-focused images. Operators may be quite good at this, however, the process is slow and inherently subjective. A variety of automated methods for determining focus have been developed but most of these methods use an aerial image monitor to determine the position of best focus. The wafer is then positioned at the best focus location by mechanical means. These methods, however, are susceptible to slight drifts in the positioning mechanism or changes in the required focus offset induced by changes in the film stack from one batch of wafers to the next.

Best focus can also be determined by phase shifted lithography where the destructive interference caused by a 180° phase transition across a critical dimension feature is used to improve the lithographic process window. Phase shifted lithography improves the lithographic process latitude or allows operation of a lower K value by introducing a third parameter on the mask. The electric field vector has a magnitude and direction, so in addition to turning the electric field on and off, it can be turned on with a 0° phase or turned on with a 180° phase. This phase variation is achieved by modifying the length that a light beam travels through the mask material. By recessing the mask an appropriate depth, light traversing the thinner portion of the mask and light traversing a thicker portion of the mask will be 180° out of phase. One problem with phase shifted mask design are the narrow lines printed by the destructive interference of light across residual phase edges, such as, phase edges that are present due to the topology of the layout design but that do not contribute constructively to the patterning process.

One conventional approach, which does not require a second exposure, is the conjugate twin shifter approach. This is described in, *Conjugate Twin-Shifter for the New Phase Shift Method to High Resolution Lithography*, Proc. SPIE, pp. 112–123, Vol. 1463, 1991. In this approach, phase shifting is accomplished not by a transition from 0° to 180° across the critical dimension feature, but rather by a 90° to 270° transition. This results in a 180° phase difference across the desired feature and only a 90° phase transition with respect to the background. The result is that the residual phase edge images with reduced contrast and exposure conditions can be adjusted so as not to print these unwanted patterns.

A phased focus monitor is disclosed in U.S. Pat. No. 5,300,786 issued to Brunner et al. The monitoring system in Brunner et al. includes a focus test mask disposed between the illumination part and the lens that projects a test pattern on the object surface. This focus monitor has drawbacks, however, in that an overlay tool is required in order to read the focus.

SUMMARY OF THE INVENTION

In view of the shortcomings of the prior art, it is an object of the present invention to provide an efficient, reliable and accurate means of quickly establishing best focus in semiconductor wafers.

It is a further object of the present invention to make this focus monitor optically readable, without the use of special metrology tools, thereby vastly reducing the resources required to analyze the data.

It is yet a further object of the present invention to make the focus monitor compact enough to allow it to be used throughout the exposure field for test site applications which require detailed across field focus mapping.

It is even a further object of the present invention to provide such a focus monitor within the constraints of the normal phase shifted mask manufacturing process.

To achieve these and other objects, and in view of its purposes, the present invention provides a focus monitor comprising: a first phase region having a first phase; a second phase region, adjacent to the first phase region, and having the first phase; and a first focus level indicator disposed between the first and second phase regions.

The present invention also provides a method for assessing the amount and direction of defocus in a lithographic system. The method comprises the steps of forming a first phase region having a first phase; forming a second phase region adjacent to and spaced apart from the second region, and having the first phase; forming an indicator between the first and second phase regions; exposing the substrate to an illumination source through the indicator to form a shape on the substrate; and determining the extent of focus and direction based on the shadow formed on the substrate.

The present invention further provides a focus monitor comprising a first phase region and a second phase region, each having a first plurality of phase sections having a first phase and a second plurality of phase sections adjacent to the first phase region, and having a second phase. A plurality of level indicators is disposed between respective ones of the plurality of the first and second phase sections, such that the level indicators and the first and second phase sections form a respective plurality of focus level regions. In addition, a plurality of separators are disposed between respective ones of the plurality of focus level regions.

The present invention also provides a focus monitor comprising a phase structure having a plurality of first phase regions and a plurality of second phase regions. Each one of the plurality of second phase regions is adjacent to a respective one of the plurality of the first phase regions. The plurality of first phase regions and the plurality of second phase regions have a first phase and are divided into a plurality of sections. A plurality of level indicators is disposed between respective ones of the plurality of sections, such that the level indicators and the plurality of sections form a respective plurality of focus level regions. In addition, a plurality of separators may be disposed between respective ones of the plurality of focus level regions.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
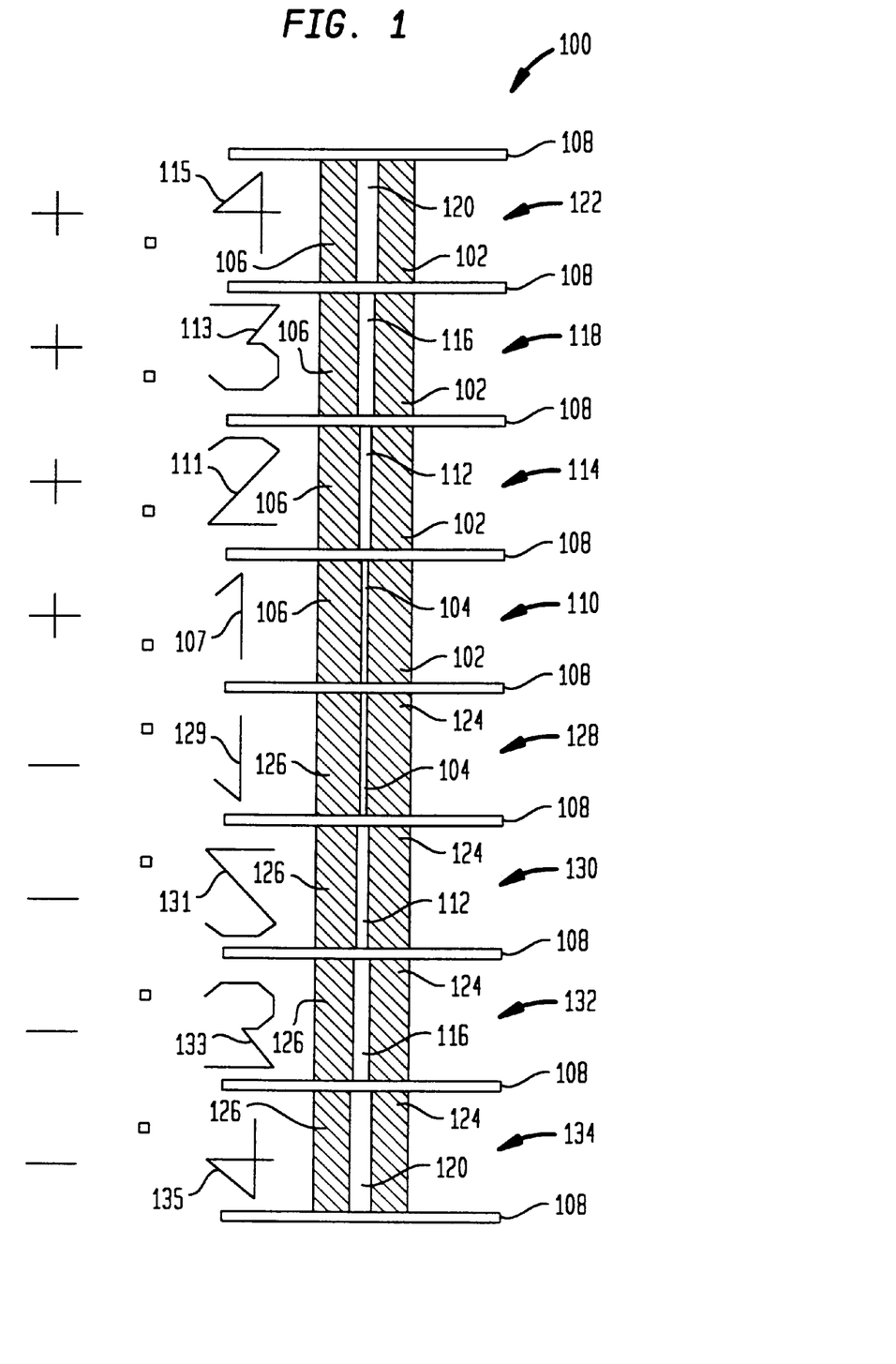
FIG. 1 is a plan view of a focus monitor according to a first exemplary embodiment of the present invention.

Referring now to the drawing, wherein like reference numerals refer to like steps and elements throughout, FIG. 1 is a plan view of a focus monitor according to a first exemplary embodiment of the present invention. In FIG. 1, focus monitor 100 includes a first phase region 102 and a second phase region 106. Regions 102 and 106 are transparent phase shifted mask features having the advantage of making the focus monitor readable. Regions 102 and 106 may have any shape and orientation but are shown as having a rectangular shape in a vertical setting for illustrative purposes only. For example, regions 102 and 106 may have any shape, such as a triangle, circle, square, and a polygon, based on desired design constraints. Regions 102 and 106 may also be laid out in any position, such as horizontally, vertically or slanted at different angles based on design constraints and material limitations. Regions 102 and 106 have the same phase which preferably may be about 90° or 270°. Regions 102 and 106 may also have any width based on desired design parameters.

Focus monitor 100 further includes a first focus level indicator 104 disposed between regions 102 and 106. The first focus level indicator (phase gap) 104 may have a variety of widths or gap sizes which may be fine-tuned according to the desired design resolution. The gaps are chosen to correspond to separations at which a discernible image is created at various focal planes for a given exposure dose. The exact spacing may be fine-tuned for given design grids, exposure parameters, and resist formulations for example. The gap width may be determined by the following equation:

$$GW = (DF - 0.354)/1.926 \qquad (2)$$

where GW is the gap width, DF is the desired focus, and where the constants were obtained through simulation and linear regression. All measurements are taken in Rayleigh units.

The minimum usable gap width is based on the design grid and a minimum dimension of the substrate where the shadow of the projecting light would be created. The gap width of the additional indicators may increase at a predetermined increment, for example, based on the design grid and/or the minimum dimension. As an example, the gap size chosen for the first focus level indicator 104 of the present invention is 122.5 nm based on 17.5 nm design grid, 0.6 NA, 0.45 sigma, and a 248 nm exposure system. This results in the ability to measure 0.1 micron defocus. It should be noted that this value for indicator 104 may be derived from equation (2).

The first focus level indicator 104 and both phase regions 102 and 106 form a first focus level region 110. Monitor 100 may further include label 107 to indicate the amount of defocus represented by the first focus level region 110 (in nm for a 248 nm, 0.6 NA focus monitor system) at which an image or shadow should print on the substrate in the region corresponding to the phase gap. Label 107 may be of any type, such as letters, numbers or symbols that can be used to identify a focus or defocus level.

Focus monitor 100 may also include a second focus level region 114 separate from the first focus level region 110. Separators 108 may also be used as dividers to make it easier to read the shadow formed on the substrate in order to determine the level of defocus. Separators 108 may be placed orthogonal to regions 110 and 114 or at any angle subject to design parameters or other constraints.

Second focus level region 114 is similar to first focus level region 110. The only difference between first focus level region 110 and second focus level region 114 is the width (gap size) of the second level indicator 112 which is disposed between regions 102 and 106. As mentioned above with respect to the first focus level indicator 104, second focus level indicator 112 may have a variety of widths or gap sizes which may be fine-tuned according to desired design resolution. In this exemplary embodiment, the size of the second focus level indicator 112 is larger than the first focus level indicator 104 in order to indicate a greater defocus value as described in equation (2). As an example, the gap size chosen for the second level indicator 112 of the first exemplary embodiment was 157.5 nm based on 17.5 nm design grid, 0.6 NA, 0.45 sigma, and a 248 nm exposure system. The gap size will be determined according to the particular parameters of the lithographic system. Label 111 may be used to indicate a second defocus level for the second focus level region 114.

The focus monitor 100 may further include a third focus level region 118 separated from the second focus level region 114 by separator 108. As discussed above, the only difference between the third focus level region 118 and focus level regions 110 and 114 described above is the width of third level indicator 116 in order to show a greater defocus value. In this exemplary embodiment, the width chosen for the third level indicator 116 is about 227.5 nm based on 17.5 nm design grid, 0.6 NA, 0.45 sigma, and a 248 nm exposure system. Label 113 may be used to indicate a third defocus level for the third focus level region 118.

Focus monitor 100 may also include additional focus level regions as desired (shown in FIG. 1 as region 122). As described above, any additional regions would be similar to region 110 except for the gap width, so as to indicate a desired defocus value. In this exemplary embodiment, the width chosen for level indicator 120 is about 297.5 nm based on 17.5 nm design grid, 0.6 NA, 0.45 sigma, and a 248 nm exposure system. Label 115 may be used to indicate a further defocus level for the focus level region 122.

As it may also be desirable to determine a direction of defocus in addition to a level of defocus, monitor 100 may also include a focus level region 128 disposed below and separate from focus level region 110. Focus level region 128 includes phase region 124 and phase region 126 which vary from the phase of focus level region 110 by about 180°. This introduces an additional feature to the present invention by helping the user identify the direction of defocus, in addition to the amount of defocus. This may be used to determine the direction of the focus setting adjustment of the projecting light with respect to the wafer and may minimize calibration time and setup. Focus level region 128 may also include first level indicator 104 having characteristics similar to those of focus level region 110. As described above, label 129 may be used to indicate a defocus value for focus level region 128.

Monitor 100 may further include focus level regions 130, 132 and 134. These regions may be separated by separators 108. Focus level regions 130, 132, and 134 have elements similar to those of focus level regions 114, 118 and 122 respectively. The phase of regions 130, 132 and 134, however, is shifted from the phase of regions 114, 118 and 122 by about 180°. As described above, this feature of monitor 100 may be used to identify the direction of the defocus in order to adjust, with a minimum amount of time, the focus position of the exposure tool relative to the wafer. Positive versus negative defocus are tool specific definitions and should be set up according to local conventions.

Figure 1A:
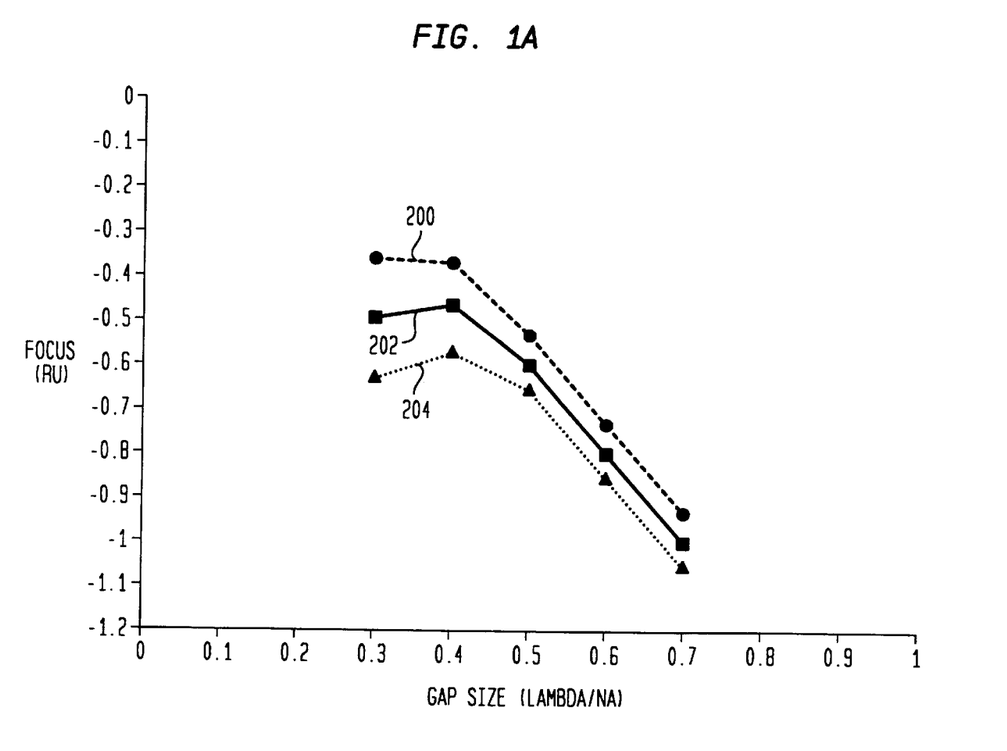
FIG. 1A is a graphical chart of results obtained from a simulation based on the focus monitor of FIG. 1.

FIG. 1A illustrates results of a simulation based on focus monitor 100. In FIG. 1A, a plot is shown of the point in focus at which a discernible image is patterned by the gap between two identical phase regions (90° or 270°) a variety of exposure doses. This is plotted as a function of gap size (x-axis), focus (y-axis) and a variety of exposure doses. The units are generic to any lithography system. The gap size is λ (wavelength) divided by Numerical Aperture (NA). For example, for a standard 248 nm deep ultra violet (DUV) tool at 0.5 NA, 0.5 on the x-axis would be 0.5*248/0.5=248 nm. The y-axis is in Rayleigh units (RU) of focus and is $0.5*\lambda/(NA)^2$. So, for a 0.5 NA, 248 nm system, this means that −0.5 on the y-axis is −0.5* 0.5* 248/(0.5)2=−248 nm defocus. The dose is in terms of multiples of the "dose to clear" which is the dose at which the resist actually develops away. For example, 3.0*E0 is three times the dose to clear which is a reasonable operating point. Shown in FIG. 1A are plots 200, 202 and 204 which correspond to multiple of doses 2.9, 3.1 and 3.5, respectively. This graph also shows that the focus point at which the indicator prints is a strong function of the indicator width and has a weak linear dependence on the dose.

FIG. 1A further shows that the effect is linear down to a gap width of about 0.4. A gap smaller than about 0.4 may not yield any further resolution. FIG. 1A shows that after that point (0.4), the curve flattens out, such that all focus resolution is lost. In other words, the smallest detectable defocus is somewhere around 0.4–0.5 RU for this exemplary embodiment.

Figure 2:
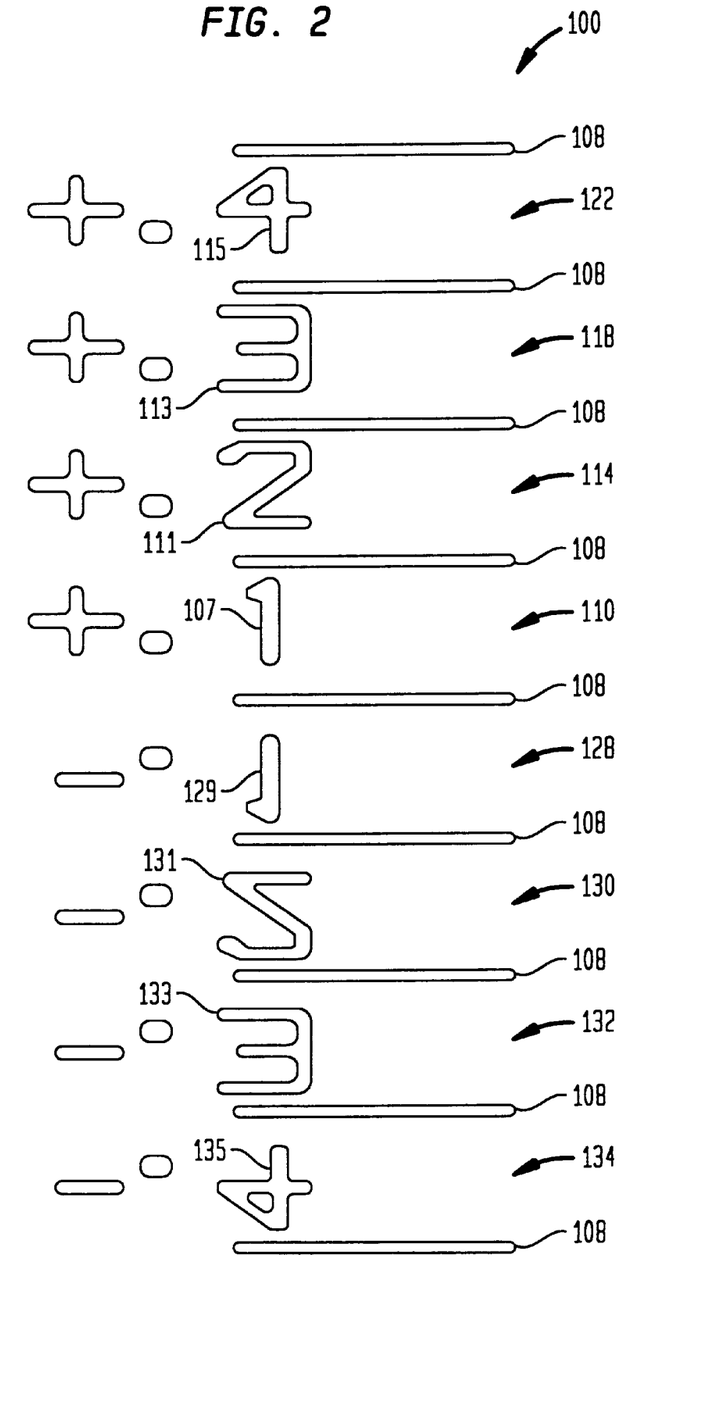
FIG. 2 is a plan view of a contour formed at a first focus value according to the first exemplary embodiment.

FIG. 2 is a plan view of a contour formed at a first focus value according to the first exemplary embodiment. In FIG. 2, the lines displayed represent separators 108 and labels 107, 111, 113, 115, 129, 131, 133, and 135 shown in FIG. 1, and correspond to a 3.0*E0 intensity contour for a 0.6 NA, 0.45 sigma, and a 248 nm exposure system. This contour closely approximates the image patterned by a typical exposure tool for which monitor 100 was designed. These parameters may be changed to suit the specific design requirements. In FIG. 2, monitor 100 shows an in-focus image at an approximately 0-defocus level because no level indicator shapes such as, 104, 112, 116, and 120, shown in FIG. 1 corresponding to shadows formed on the substrate to indicate defocus, are visible.

Figure 3:
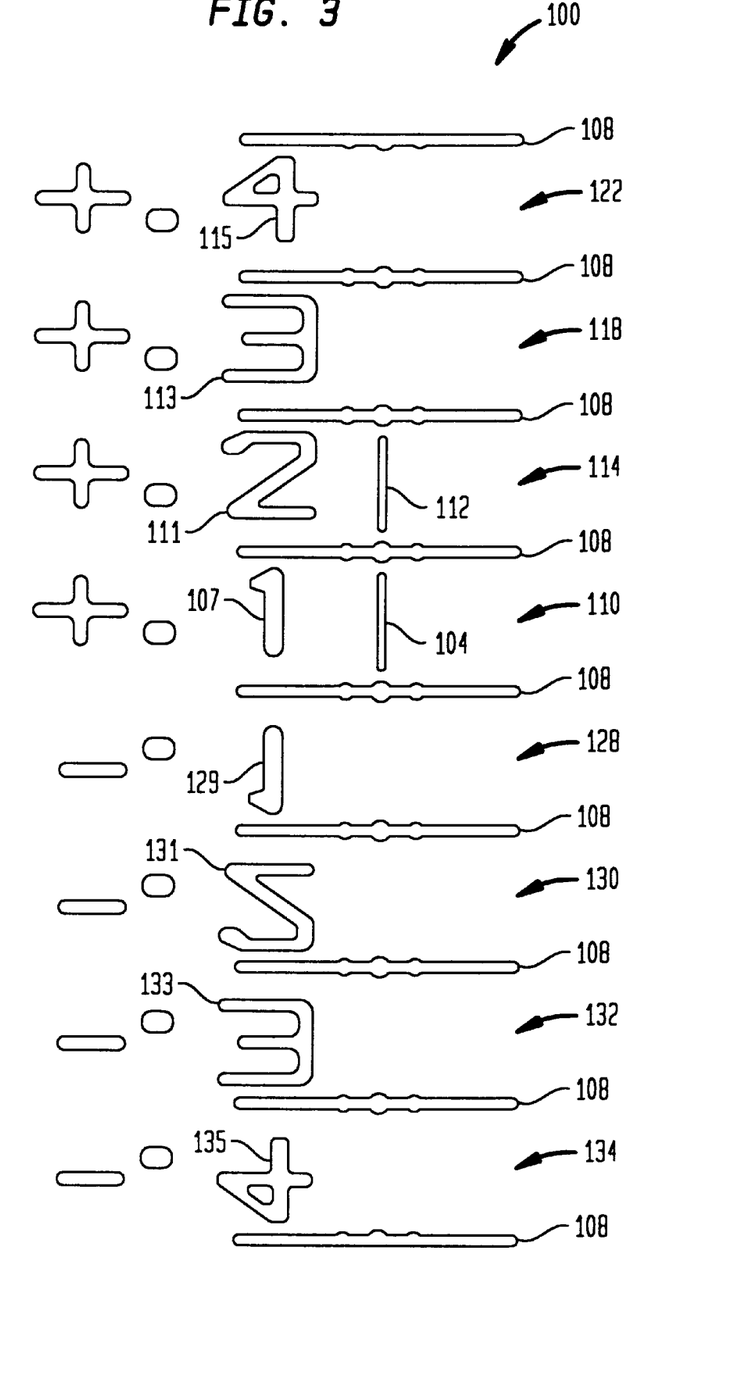
FIG. 3 is a plan view of a contour formed at a second focus value according to the first exemplary embodiment.

FIGS. 3, 4, 5 and 6 show the same monitor structure under the same exposure conditions as described with respect to FIG. 2. FIG. 3 is a plan view of a contour formed at a second focus value according to the first exemplary embodiment. In FIG. 3, monitor 100 shows an approximately 200-nm defocus level corresponding to the highest visible level indicator 112 in focus level region 114. This defocus level is based on an exemplary gap size of 157.5 nm.

Figure 4:
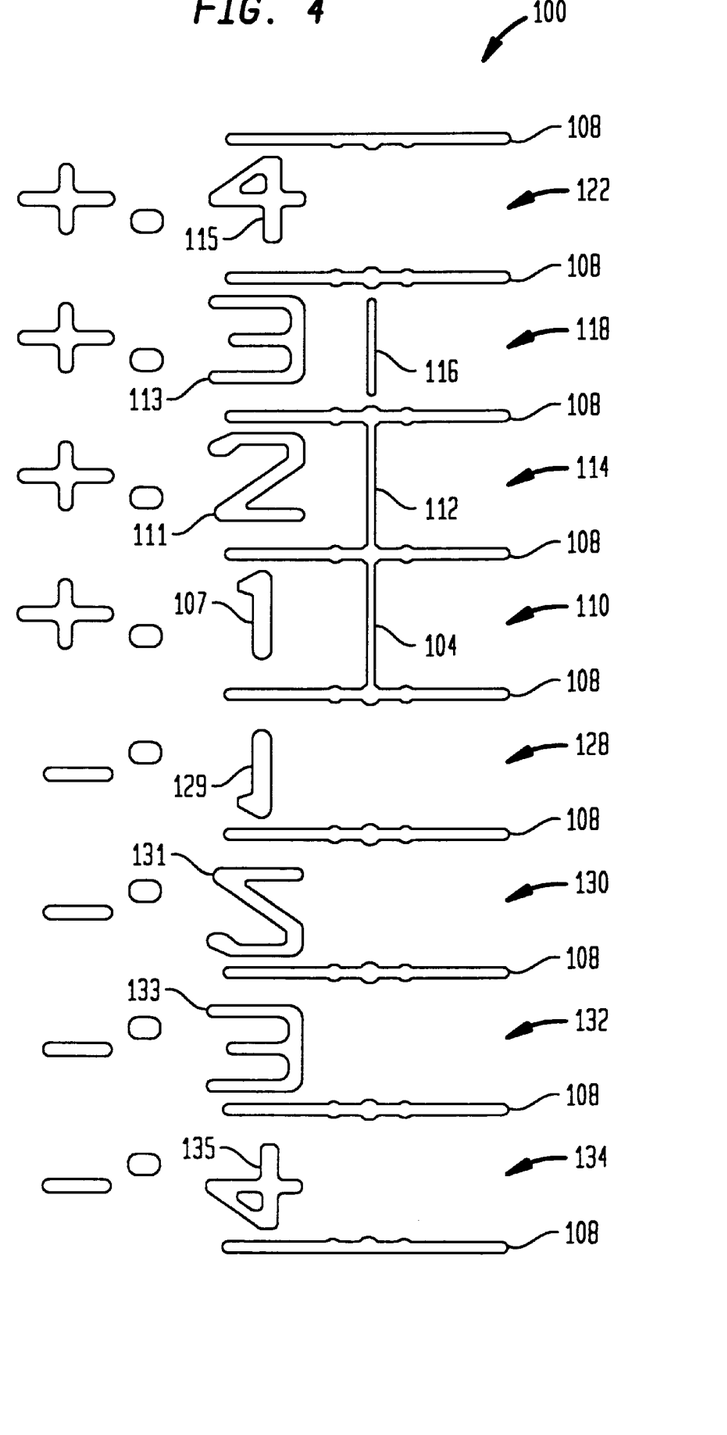
FIG. 4 is a plan view of a contour formed at a third focus value according to the first exemplary embodiment.

FIG. 4 is a plan view of a contour formed at a third focus value according to the first exemplary embodiment. In FIG. 4, monitor 100 shows an approximately 300-nm defocus level corresponding to the highest visible level indicator 116 in focus level region 118. This defocus level is based on an exemplary gap size of 227.5 nm.

Figure 5:
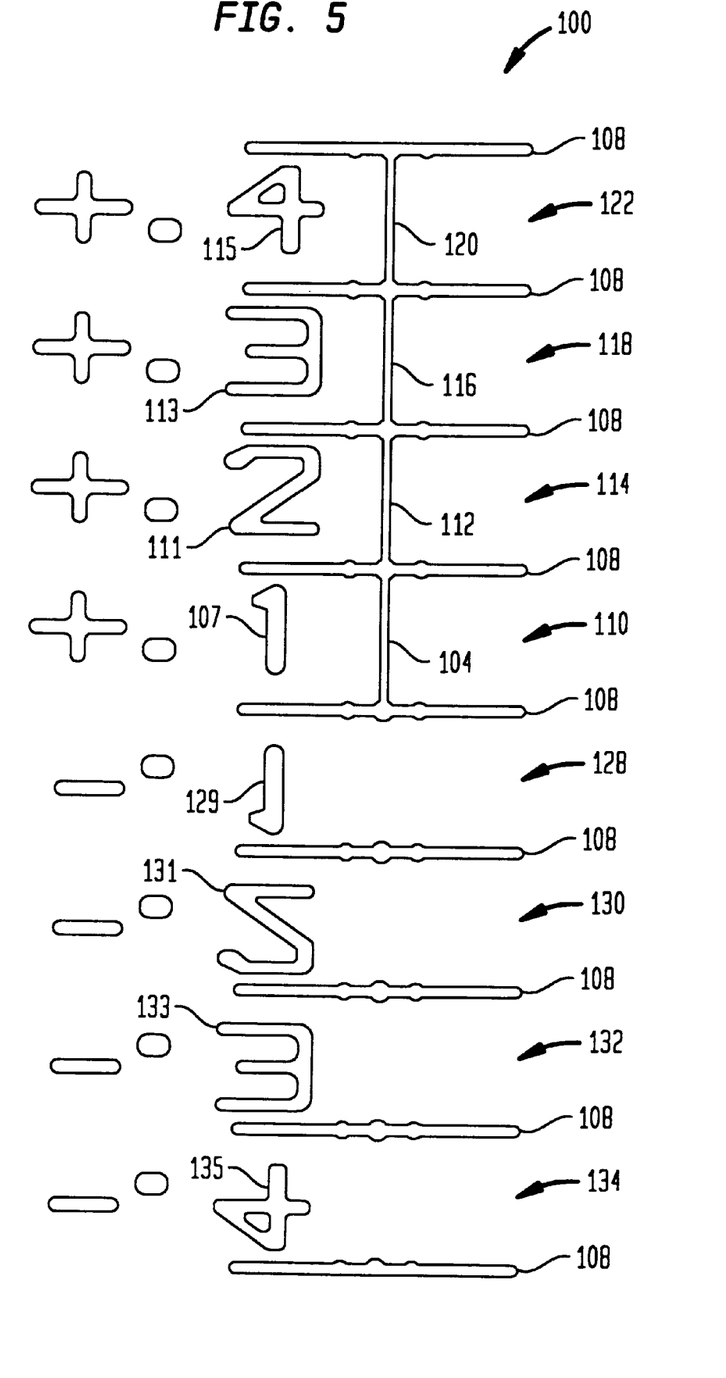
FIG. 5 is a plan view of a contour formed at a fourth focus value according to the first exemplary embodiment.

FIG. 5 is a plan view of a contour formed at a fourth focus value according to the first exemplary embodiment. In FIG. 5, monitor 100 shows an approximately 400-nm defocus level corresponding to the highest visible level indicator 120 in focus level region 122. This defocus level is based on an exemplary gap size of 297.5 nm.

Figure 6:
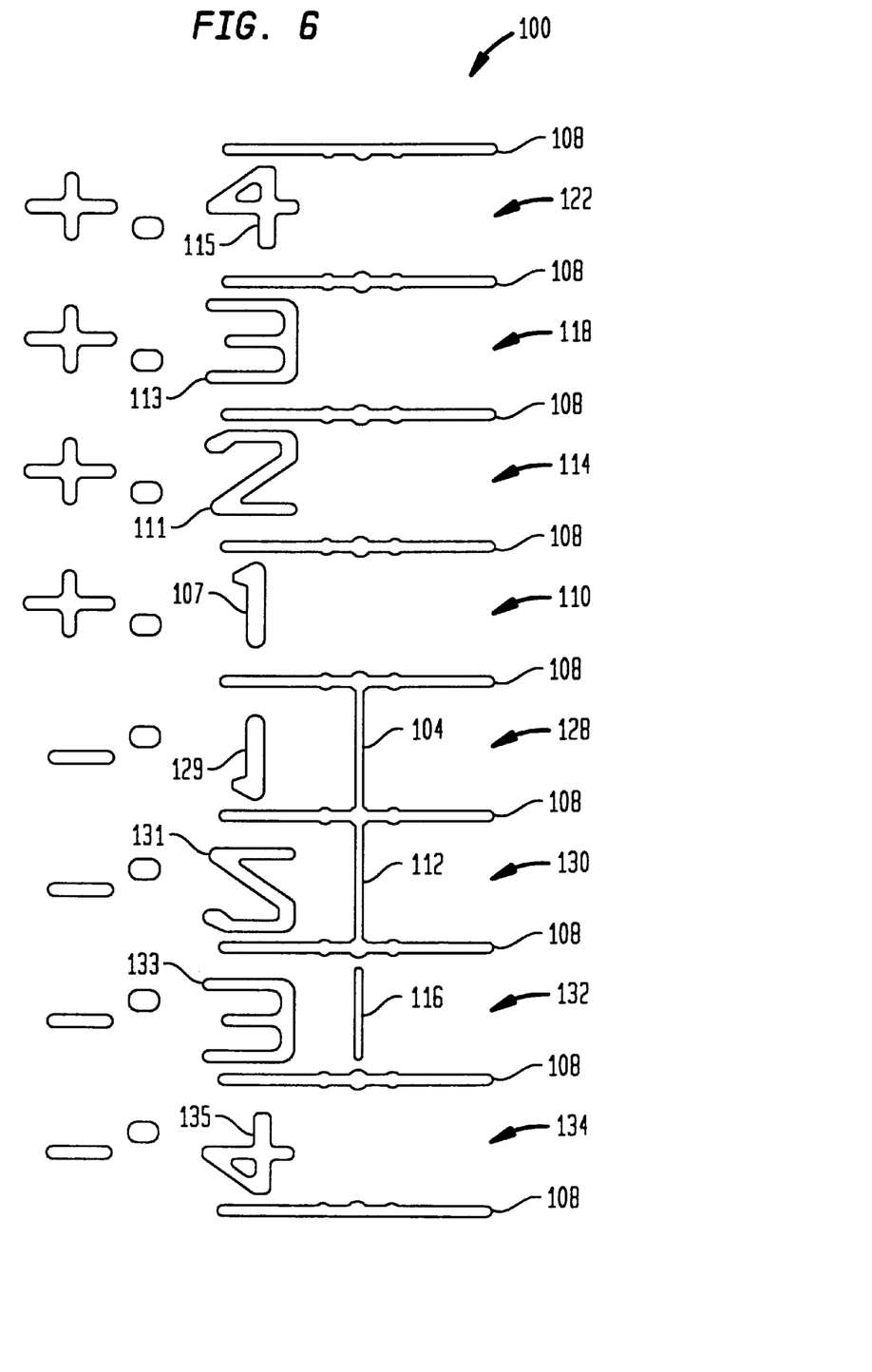
FIG. 6 is a plan view of a contour formed at a fifth focus value according to the first exemplary embodiment.

FIG. 6 is a plan view of a contour formed at a fifth focus value according to the first exemplary embodiment. In FIG. 6, monitor 100 shows an approximately 300-nm defocus level, in the negative direction, corresponding to the highest visible level indicator 116 in focus level region 132. This defocus level is based on an exemplary gap size of 227.5 nm and a phase region 124, 135 (shown in FIG. 1) which is 180° out of phase with respect to the phase of region 104 and 106 (used to indicate positive defocus conditions).

Figure 7:
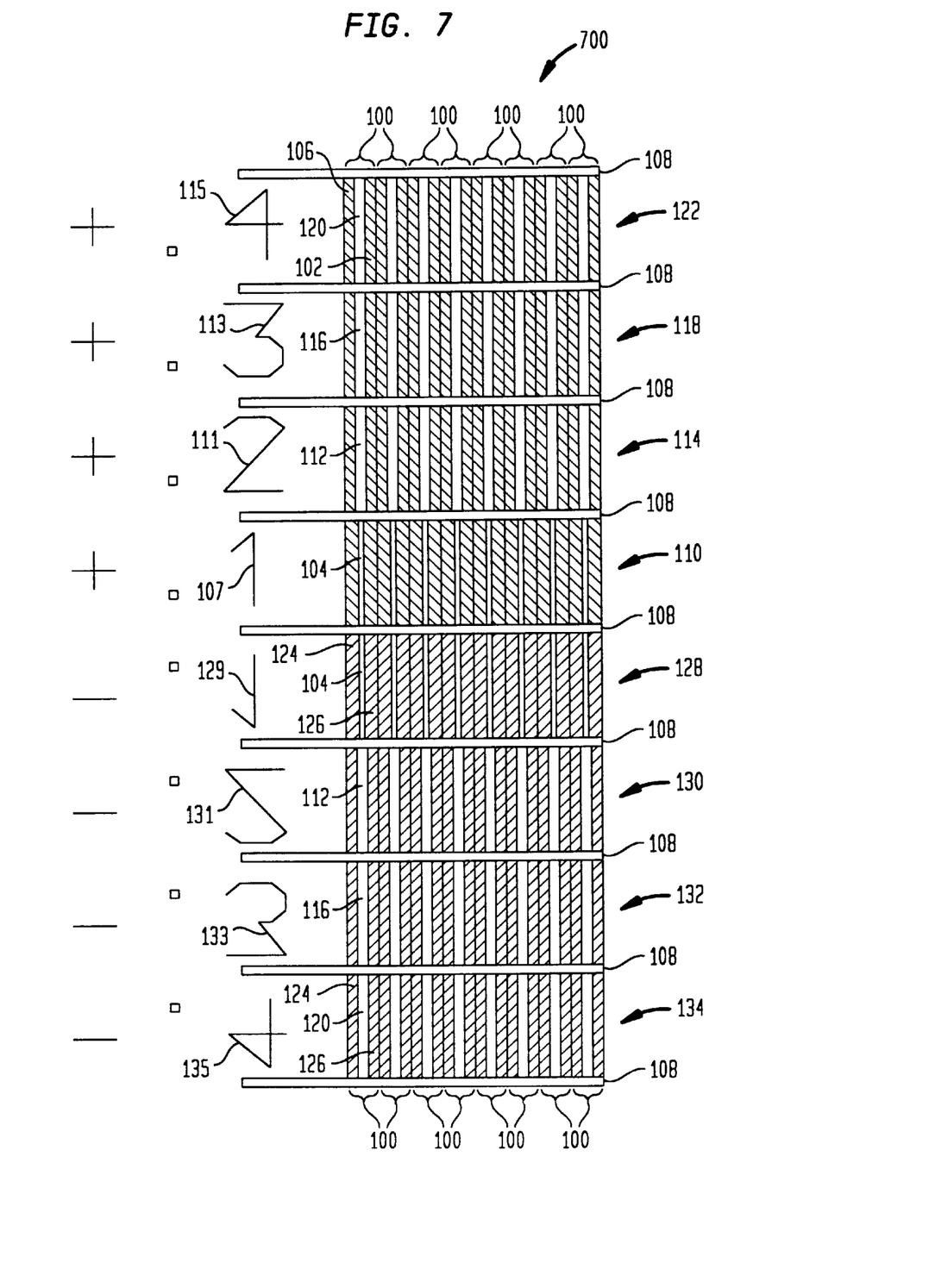
FIG. 7 is a plan view of a focus monitor according to a second exemplary embodiment of the present invention.

FIG. 7 is a plan view of a focus monitor according to a second exemplary embodiment of the present invention. In FIG. 7, focus monitor 700 is an array of focus monitors 100 of the first exemplary embodiment. Each monitor 100 has similar elements and functional characteristics as identified and discussed above with respect to the first exemplary embodiment. Focus monitor 700 further enhances readability by adding additional gaps per defocus range. This results in the printing of an array of lines which, under low magnification, may look like a filled in area printed on the wafer.

Figure 8:
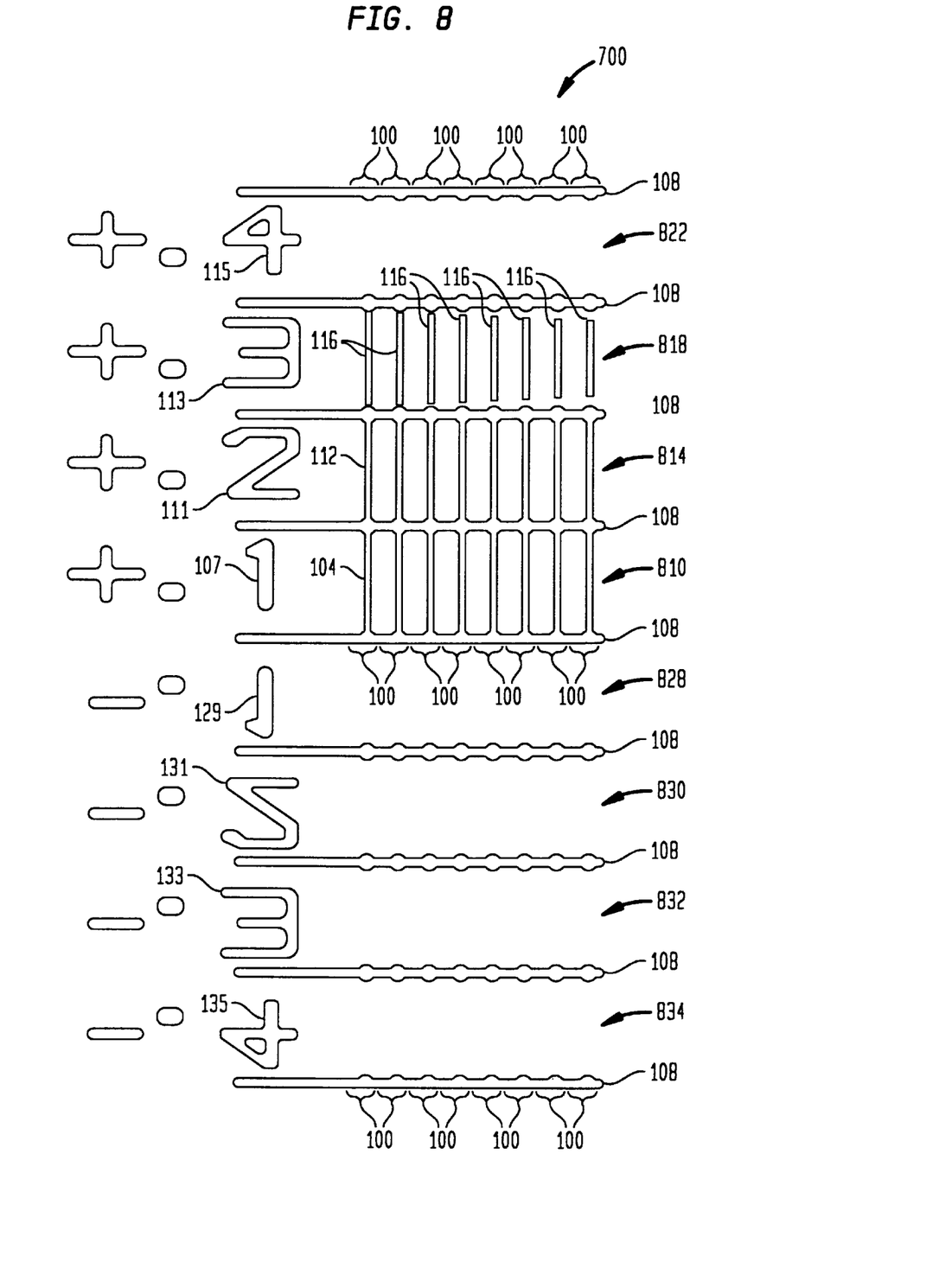
FIG. 8 is a plan view of a contour formed at a first focus value according to the second exemplary embodiment.

FIG. 8 is a plan view of a contour formed at a first focus value according to the second exemplary embodiment. In FIG. 8, the lines displayed represent separators 108 and labels 107, 111, 113, 115, 129, 131, 133, and 135 shown in FIG. 7. This contour corresponds to a 30% intensity contour for a 0.6 NA, 0.45 sigma, 248 nm exposure system and closely approximates the image patterned by a typical exposure tool for which monitor 700 was designed. These parameters may be varied to suit the desired design requirements. In FIG. 8, monitor 700 shows an approximately 300-nm defocus level corresponding to the highest level array of indicators 116 in focus level region 818. As shown in FIG. 8, the additional indicators form an array which may enhance the readability of the focus monitor at each focus level region.

Figure 9:
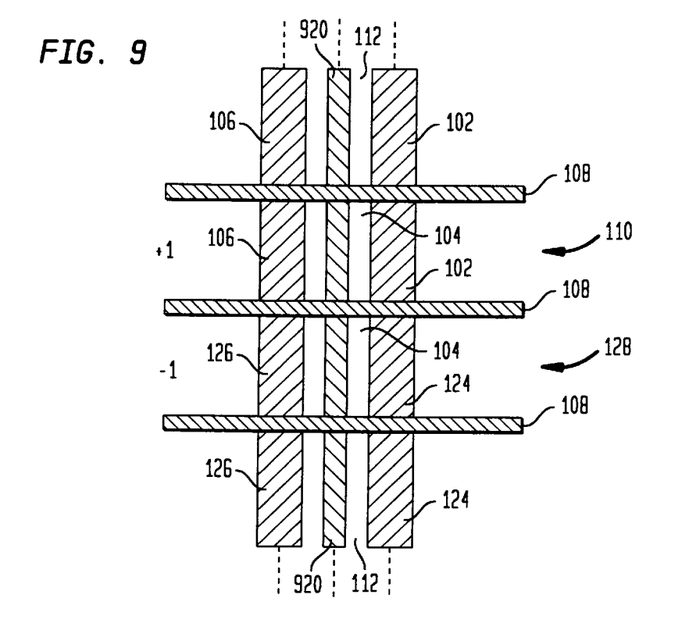
FIG. 9 is a plan view of a focus monitor according to a third exemplary embodiment of the present invention.

FIG. 9 is a plan view of a focus monitor according to a third exemplary embodiment of the present invention. In FIG. 9, focus monitor 900 is designed to overcome the fundamental resolving power limit of the focus monitor of the first exemplary embodiment. As shown in FIG. 9, a sub resolution line 920 having a phase which differs from the phase of phase regions 102 and 106 by about 180° may be inserted into indicator 104 and 112 between the phase regions 102 and 106. For example, in FIG. 9, resolution line 920 is a narrow line having a 270° phase and placed in the gap between 90° phase regions 104 and 106. This feature may need to be very narrow, such as 0.1 λ/NA. Focus monitor 900 has a higher focus resolution and provides a focus monitor which may be functional at defocus levels approaching 0 nm.

The gap width, according to the third embodiment of the present invention, is determined based on the following equation:

$$GW=(DF-0.750)/2.79 \qquad (3)$$

where GW is the gap width, DF is the desired focus, and the constants are derived through simulation and linear regression. All measurements are taken in Rayleigh units.

Figure 9A:
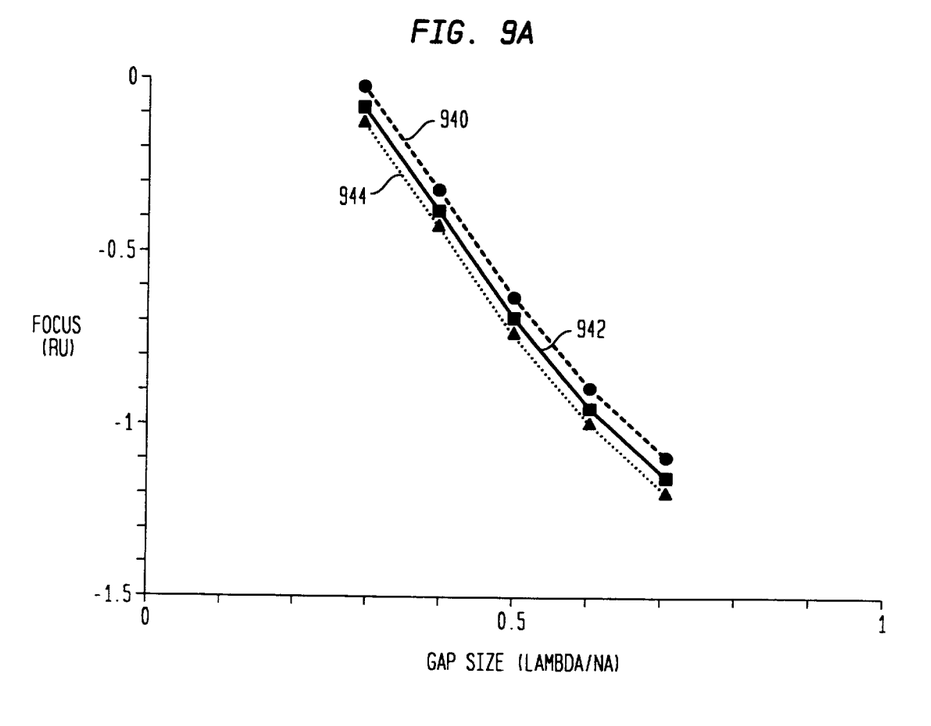
FIG. 9A is a graphical chart of results obtained from a simulation based on the focus monitor of FIG. 9.

FIG. 9A illustrates results of a simulation based on the focus monitor of FIG. 9. In FIG. 9A, the graph is based on exposure doses similar to those discussed above with respect to FIG. 1A. Shown in FIG. 9A are plots 940, 942 and 944 which correspond to multiple of doses 2.9, 3.1 and 3.5, respectively. As described above with respect to FIG. 1A, the dose is in terms of multiples of the "dose to clear". The third exemplary embodiment may eliminate the problem of being limited to focus values that are resolved at gaps larger than 0.4 λ/NA, as described in FIG. 1A. As shown in FIG. 9A, resolution is greatly enhanced to the point where the ability to resolve focus values down to an approximately 0-nm defocus may be achieved.

Figure 10:
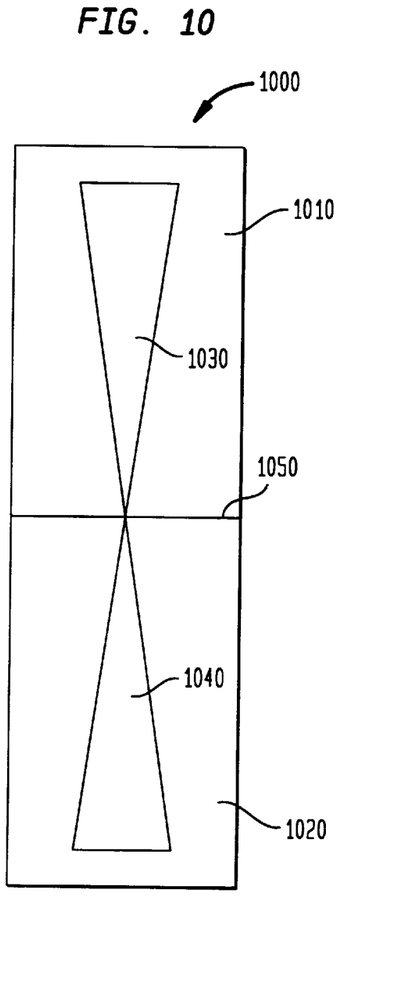
FIG. 10 is a plan view of a focus monitor according to a fourth exemplary embodiment of the present invention.

FIG. 10 is a plan view of a focus monitor according to a fourth exemplary embodiment of the present invention. In FIG. 10, focus monitor 1000 has a first phase region 1010 having a phase of about 90° or 270° for example. Indicator region 1030 having a phase of approximately 0°, for example is disposed within region 1010. In this exemplary embodiment indicator region 1030 has a wedge shape. Focus monitor 1000 may also include a second phase region 1020 having a phase which differs from the phase of region 1010 by about 180°. Within region 1020 indicator region 1040 having a phase of about 0° and a wedge shape is disposed. Wedges 1030 and 1040 have a function similar to the level indicators described above with respect to the first exemplary embodiment. Indicator regions 1030 and 1040 may have a width which increases from plane 1050 intersecting both regions 1010 and 1020. The intensity of the shadow formed by wedge 1030, 1040 indicates a defocus value and direction calculated according to equation (2) described above. Level indicators and labels are not shown in FIG. 10 but may be included as shown in the first exemplary embodiment of the present invention.

Figure 10A:
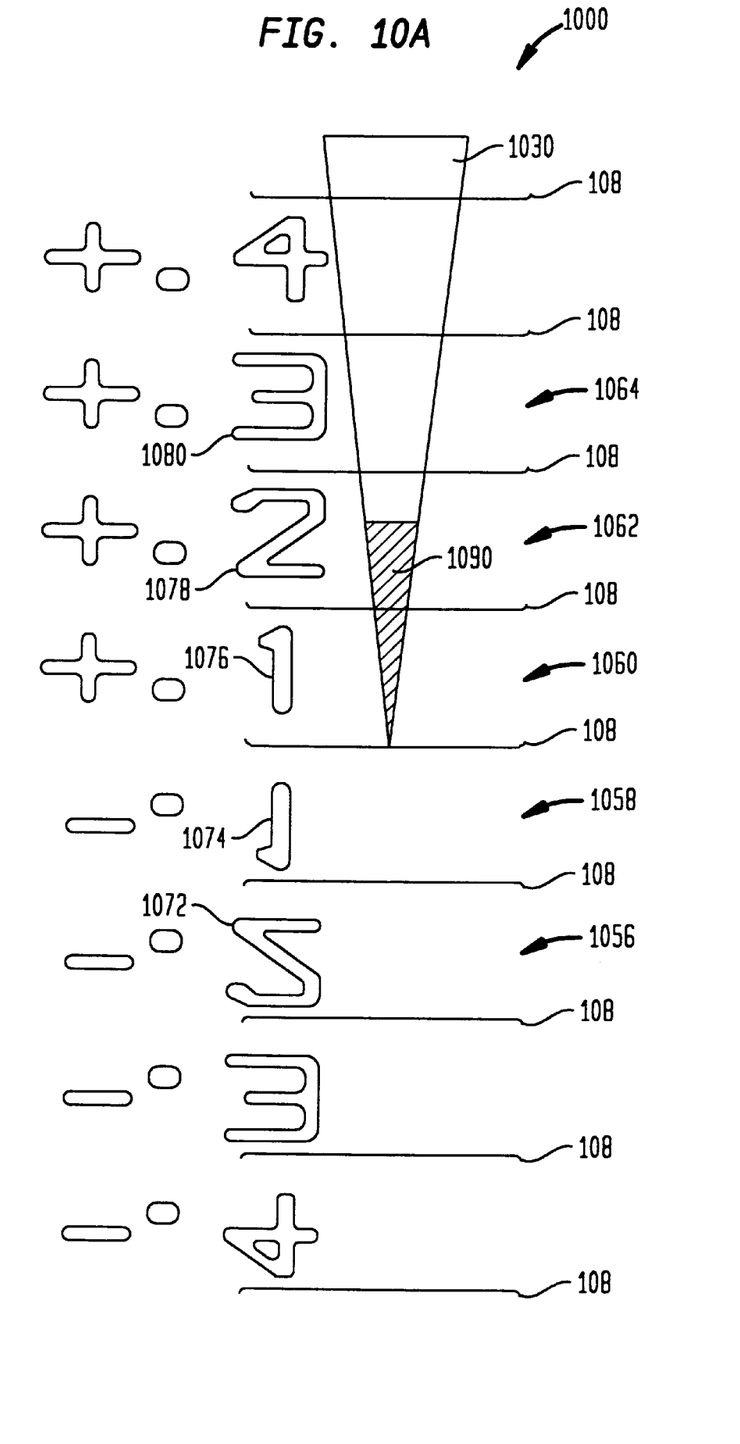
FIG. 10A is a plan view of a contour formed at a first focus value according to the fourth exemplary embodiment.

FIG. 10A is a plan view of a contour formed at a first focus value according to the fourth exemplary embodiment. In FIG. 10A, the lines displayed represent separators 108, and labels 1072, 1074, 1076, 1078 and 1080. These contour lines correspond to an approximately 3.0*E0 intensity contour for a 0.6 NA, 0.45 sigma, 248 nm exposure system and closely approximates the image patterned by a typical exposure tool for which monitor 1000 was designed. These parameters may be varied, however, to suit the desired design requirements. Shadow 1090 printed as a result of exposing the substrate through focus monitor 1000 shows an approximately 150-nm defocus level corresponding to the highest darkened level of indicator 1030 in focus level region 1060. As shown in FIG. 10A, the wedge shape of indicator improves the readability of the focus monitor in each focus level region.

Figure 11:
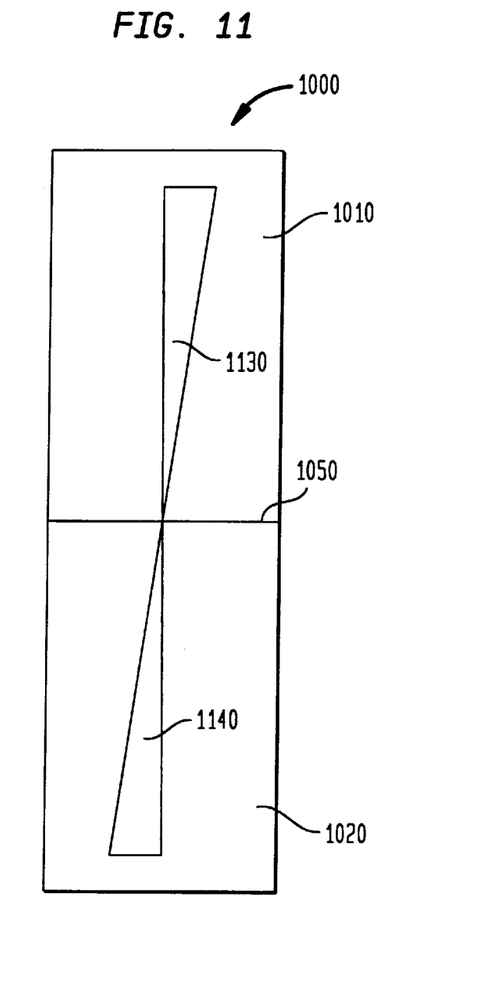
FIG. 11 is a plan view of a focus monitor according to a fifth exemplary embodiment of the present invention.

FIG. 11 is a plan view of a focus monitor according to a fifth exemplary embodiment of the present invention. In FIG. 11, focus monitor 1000 includes the same elements, similarly labeled, as described with respect to FIG. 10. The only difference between FIG. 10 and FIG. 11 is the shape of the indicators 1130 and 1140 which are tapered along a single edge in this case.

Although illustrated and described herein with reference to certain specific embodiments, the present invention is nevertheless not intended to be limited to the details shown. Rather, various modifications may be made in the details within the scope and range of equivalents of the claims and departing from the true spirit and scope of the invention.

What is claimed:

1. A focus monitor for use with a lithographic system and a substrate, said monitor comprising:

a phase region having a first phase; and a slot disposed within the phase region, said slot having a width indicative of a defocus level of the lithographic system with respect to the substrate, wherein a shadow formed on the substrate by illuminating the substrate with the lithographic system has an intensity based on the defocus level associated with the width of the slot.

2. A focus monitor according to claim 1, wherein said phase region has a shape selected from the group consisting of a rectangle, a square, a triangle and a polygon.

3. A focus monitor according to claim 1, wherein said slot has a shape selected from the group consisting of a rectangle, a triangle and a wedge.

4. A lithographic monitor according to claim 1, wherein a width of said slot is a smallest width based on at least one of a design grid and a minimum design dimension of said substrate, and a width of further slots increases at a predetermined increment based on at least one of said design grid and said minimum design dimension.

5. A lithographic focus monitor for use with an illumination source and a substrate, said monitor comprising:

a first phase region having a first phase;

a second phase region, adjacent said first phase region, said second phase region having the first phase; and a first level indicator having a predetermined width and disposed between said first and second phase regions, wherein said first level indicator and said first and second phase regions form a first focus level region indicating a defocus level based on an intensity of a shadow formed on the substrate by illuminating the substrate through the first level indicator with the illumination source.

6. A lithographic focus monitor according to claim 5, further comprising:

at least a second level indicator disposed between said first phase region and said second phase region, wherein said at least second level indicator and said first and second phase regions form at least a second focus level region adjacent a first end of said first focus level region, said at least second level region indicating at least a respective second defocus level.

7. A lithographic focus monitor according to claim 5, further comprising:

a separator disposed between said first focus level region and said at least second focus level region.

8. A lithographic focus monitor according to claim 7, further comprising a label adjacent at least one of said first focus level region and said at least second focus level region for indicating a respective defocus level.

9. A lithographic focus monitor according to claim 7, wherein said first and at least second level indicators have a respective width different from one another and selected from the group consisting of about 122.5 nm, 157.5 nm, 227.5 nm and 297.5 nm.

10. A lithographic focus monitor according to claim 5, wherein said first phase is one of about 90° and 270°.

11. A lithographic focus monitor according to claim 5, further comprising a further focus level region adjacent a second end of said first focus level region, said further focus level region having a second phase different from said first phase.

12. A lithographic focus monitor according to claim 11, wherein said second phase differs from said first phase by about 180°.

13. A lithographic focus monitor according to claim 5, wherein said first level indicator has a width selected from the group consisting of about 122.5 nm, 157.5 nm, 227.5 nm and 297.5 nm.

14. A lithographic focus monitor according to claim 5, further comprising a sub phase disposed within said first level indicator, said sub phase having a second phase which differs from the first phase by about 180°.

15. A lithographic focus monitor according to claim 5, wherein the first level indicator has a width according to the following equation:

$$(DF-0.354)/1.926,$$

where DF is a desired defocus level measured in Rayleigh units.

16. A lithographic monitor according to claim 5, wherein a width of said indicator is a smallest width based on at least one of a design grid and a minimum design dimension of said substrate, and a width of further indicators increases at a predetermined increment based on at least one of said design grid and said minimum design dimension.

17. A lithographic focus monitor for use with a substrate, said monitor comprising:

a first phase region and a second phase region, each including i) a first plurality of phase sections having a first phase and ii) a second plurality of phase sections having a second phase, said second phase region adjacent said first phase region;

a plurality of level indicators, disposed between respective ones of said plurality of first and second phase sections, wherein said plurality of level indicators and said first and second plurality of phase sections form a respective plurality of focus level regions indicating a respective plurality of defocus levels; and a plurality of separators disposed between said plurality of focus level regions.

18. A lithographic focus monitor according to claim 17, wherein said first phase is one of about 90° and 270°.

19. A lithographic focus monitor according to claim 18, wherein said second phase differs from said first phase by about 180°.

20. A lithographic focus monitor according to claim 17, further comprising a plurality of labels adjacent respective ones of said plurality of focus level regions for indicating a defocus level for each of said plurality of level regions.

21. A lithographic focus monitor according to claim 17, wherein said plurality of level indicators each have a width according to the following equation:

$$(DF-0.354)/1.926,$$

where DF is a desired defocus level.

22. A lithographic focus monitor according to claim 17, further comprising a sub phase disposed within at least one of said plurality of level indicators, said sub phase having a second phase which differs from the first phase by about 180°.

23. A lithographic focus monitor according to claim 22, wherein said plurality of level indicators each have a width according to the following equation:

$$(DF-0.750)/2.79,$$

where DF is a desired defocus level.

24. A lithographic focus monitor for use with a substrate, said monitor comprising:
    a phase structure having a plurality of first phase regions and a plurality of second phase regions, each one of said plurality of second phase regions adjacent a respective one of said plurality of first phase regions, said plurality of first phase regions and said plurality of second phase regions having a first phase and divided into a plurality of phase sections;
    a plurality of level indicators, disposed between respective ones of said plurality of phase sections, wherein said level indicators and said plurality of phase sections form a respective plurality of focus level regions indicating a defocus level; and
    a plurality of separators disposed between respective ones of said plurality of focus level regions.

25. A lithographic focus monitor according to claim 24, wherein said first phase is one of about 90° and 270°.

26. A lithographic focus monitor according to claim 24, further comprising a plurality of labels adjacent respective ones of said plurality of focus level regions identifying a defocus level.

27. A lithographic focus monitor according to claim 24, wherein said plurality of level indicators each have a width according to the following equation:

$$(DF-0.354)/1.926,$$

where DF is a desired defocus level.

28. A lithographic focus monitor according to claim 24, further comprising a sub phase disposed within at least one of said plurality of level indicators, said sub phase having a second phase which differs from the first phase by about 180°.

29. A lithographic focus monitor according to claim 28, wherein said plurality of level indicators each have a width according to the following equation:

$$(DF-0.750)/2.79,$$

where DF is a desired defocus level.

30. A focus monitor for use with a lithographic system and a substrate, said monitor comprising:
    a first phase region having a first phase; and
    an indicator having a wedge shape, disposed within said first phase region, said indicator having an increasing width from a predetermined point, wherein an intensity of a shadow formed by said wedge on said substrate, at any given width of said wedge, corresponds to a defocus value of said lithographic system with respect to said substrate.

31. A lithographic focus monitor according to claim 30, wherein said first phase is one of about 90° and 270°.

32. A lithographic focus monitor according to claim 30, further comprising a second phase region adjacent said first phase region, and having a second phase different from said first phase.

33. A lithographic focus monitor according to claim 30, wherein said second phase differs from said first phase by about 180°.

34. A method for determining at least one of a value and a direction of defocus on a substrate for use with a lithographic system, said method comprising the steps of:
    (a) forming a phase region, having a first phase;
    (b) forming a slot within said first region;
    (c) illuminating the substrate with the lithographic system through said slot to form a shadow on said substrate; and
    (d) determining at least one of said defocus value and said direction based on an intensity of said shadow formed on said substrate.

35. A lithographic focus monitor according to claim 34, wherein said intensity of said shadow is based on the width of the first level indicator and an intensity of the illumination source.

36. A lithographic focus monitor according to claim 34, wherein said defocus value determined in step (d) is based on a value of the first phase and a width if the slot.

* * * * *